United States Patent [19]
Kozel et al.

[11] Patent Number: 5,586,008
[45] Date of Patent: Dec. 17, 1996

[54] GRAVITY LATCH FOR SURFACE MOUNT COMPONENTS

[75] Inventors: Charles A. Kozel, McHenry; John Oldendorf, Prospect Heights; John T. Scheitz, Barrington, all of Ill.; Tuan J. Tan, Singapore, Singapore

[73] Assignee: Methode Electronics, Inc., Chicago, Ill.

[21] Appl. No.: 389,108

[22] Filed: Feb. 15, 1995

Related U.S. Application Data

[63] Continuation-in-part of Ser. No. 301,022, Sep. 6, 1994.
[51] Int. Cl.[6] .................................................. H05K 1/14
[52] U.S. Cl. ........................ 361/743; 439/83; 361/760; 361/825; 174/260
[58] Field of Search .................................. 361/760–764, 361/785, 791, 825, 743; 228/179.1, 180.1, 180.21; 439/55, 83; 174/260–261

[56] References Cited

U.S. PATENT DOCUMENTS

5,352,851  10/1994  Wallace et al. .................... 174/52.4

Primary Examiner—Bot L. Ledynh
Attorney, Agent, or Firm—David L. Newman

[57] ABSTRACT

A latch connected to a surface mount component for subsequent connection to a printed circuit board is provided as well as a method for mounting a surface mount component to a printed circuit board having a zero mounting force. The surface mount component has a soldering tail extending therefrom and at least one latch or latch contact insertable through an aperture in the printed circuit board, without force, such that the soldering tails extending from the surface mount component rest on corresponding soldering pads of the printed circuit board. As a result, surface mount components are mountable to a printed circuit board using standard, available equipment, such as a vacuum head placed component which allow for placement of the component via gravity, and the components are subsequently soldered to the printed circuit board. The assembly also includes a board latch pin and a weighted cap.

17 Claims, 6 Drawing Sheets

GRAVITY LATCH FOR SURFACE MOUNT COMPONENTS

This application is a continuation-in-part of application U.S. Ser. No. 08/301,022, filed Sep. 6, 1994.

BACKGROUND OF THE INVENTION

The present invention generally relates to an apparatus and a method for attaching one or more components to another component. More specifically, the present invention relates to a latch for connecting a surface mount component to a printed circuit board prior to soldering of the component to form an assembly.

It is, of course, generally known to add components to a printed circuit board. Many components, however, are mounted at or near an edge of the printed circuit board or even off of the edge of the printed circuit board.

To mount such components, solder screening of the printed circuit board is first conducted followed by placement of the components on or near the printed circuit board. Then, reflow soldering of the assembled component to the circuit board is required to complete the process for assembly of surface mount components to the printed circuit board.

Many components, however, such as connectors, are unstable prior to the reflow soldering process. As previously mentioned, some components are mounted toward the edge or off of the edge of the printed circuit board. Therefore, prior to the reflow soldering process, these components must be mechanically held in place.

A couple of variations have been proposed to mechanically hold the components prior to the reflow soldering process. One such proposal is extension of rails of the printed circuit board itself. That is, two opposite sides of the printed circuit board are extended to form strips beyond an end of the printed circuit board. At that end, the surface mount components require attachment to the printed circuit board and may be balanced between the extended sides or rails of the printed circuit board thereby mechanically holding the components prior to reflow soldering of the same.

Alternatively, another known method for mechanically holding a surface mount component prior to the reflow soldering process is to provide a mechanical-type support attached as an extension of the surface mount component. The support or extension requires a press fit into an aperture formed in the printed circuit board.

Each of these known methods, however, have drawbacks. The extended support rails from the printed circuit board are generally fragile. Furthermore, the support rails do not force the surface mount component tail into the soldering pad as is necessary for securing the surface mount components to the printed circuit board.

Likewise, the mechanical press-in support requires a force in the Z-direction (or Z-force), i.e., a force perpendicular to a plane of the printed circuit board to seat the surface mount components in the printed circuit board. A standard assembly mechanism uses a vacuum to pick the surface mount components and place the surface mount components in the assembly as required. However, a Z-force is not available for such a typically available pick and place vacuum assembly for mounting surface mount components to printed circuit boards.

A need, therefore, exists for an improved latch for surface mounting components to a printed circuit board that both lutes and holds down the surface mount components during a pick and place assembly operation and further provides location and stability throughout the assembly including during the reflow soldering process.

SUMMARY OF THE INVENTION

The present invention provides a latch, a method for surface mounting a component, and a combined assembly of a printed circuit board and attached surface mount components. The latch of the present invention extends through an aperture in a printed circuit board such that soldering tails extending from a component for surface mounting from which the latch extends rest on the circuit board in an orientation for soldering of the tails to the circuit board.

To this end, in an embodiment, the present invention provides a latch extending from a component having a plurality of soldering tails extending substantially equidistantly from an end of the component at points substantially equidistantly from a base of the component wherein the component requires mounting to a printed circuit board. The latch has a first member having a first end connected to the component in a direction substantially perpendicular to the length of the component. The first end is connected to the component. A second end of the latch extends approximately equal to the distance of the plurality of soldering tails wherein the rigid member is constructed and arranged such that the second end terminates at a point at or below the point at which the soldering tails are arranged above the base.

In an embodiment, the rigid member of the latch of the present invention extends from the component for a length approximately equal to the length of the soldering tails.

In an embodiment, the rigid member of the latch of the present invention has a hook formation at the second end.

In an embodiment, the latch further comprises a soldering tab intermediately located between the first end and the second end.

In an embodiment, the rigid member of the latch of the present invention is molded as a part of the component.

In an embodiment, the rigid member of the latch of the present invention is die-stamped and attached to an end of the component.

In an embodiment, the rigid member of the latch of the present invention is a wire pin extending from the end of the component from which the plurality of soldering tails extend.

In another embodiment of the present invention, a method is provided for surface mounting a component to a printed circuit board requiring soldering of a plurality of soldering tails extending substantially equidistantly from the components to secure the components to the printed circuit board. The method comprises the steps of: providing an aperture in the printed circuit board; providing a member extending from the component a distance from the component approximately equal to the distance of the plurality of soldering tails; and placing the member through the aperture, without force, to connect the component to the printed circuit board wherein the placement effects placement of the soldering tails.

In an embodiment, the method further comprises the step of soldering the plurality of soldering tails to the printed circuit board.

In an embodiment, the method further comprises the step of die-stamping the member attached to the component.

In an embodiment, the method further comprises the step of molding the member as a part of the component.

In an embodiment, the method further comprises the step of using a vacuum head to hold the component and to place the member through the aperture.

In another embodiment of the present invention, a combined assembly of a printed circuit board and an attached surface mount component is provided. The combined assembly has a plurality of soldering tails extending from the component and a first support latch extending substantially parallel from the component. An aperture through the printed circuit board receives the first support latch therethrough wherein the plurality of soldering tails rests on a face of the printed circuit board through which the first support latch extends. The first support latch has a cross-sectional area smaller than the aperture thereby receiving the first support latch without force.

In an embodiment, the combined assembly has a plurality of soldering paths on the face of the printed circuit board corresponding to the plurality of soldering tails. Each of the plurality of soldering tails rests on a corresponding one of the plurality of soldering pads.

In an embodiment, the combined assembly further comprises a second or more support latches remotely attached to the component at a distance from the first support latch. The second support latch is substantially identical to the first support latch.

In an embodiment a latch contact is provided for mounting and latching a component to a printed circuit board wherein the solder tails and the latch contact rest on corresponding solder pads of the printed circuit board.

In an embodiment, the combined assembly includes a board locking pin for adding mechanical strength to the assembly.

In an embodiment, the combined assembly includes a cap temporarily placed on a component pin of the component to provide for weighting of the component and a surface for robotic pick and placement.

It is, therefore, an advantage of the present invention to provide a latch for surface mounting components to a printed circuit board.

Another advantage of the present invention is to provide a latch, a method for surface mounting and a combined assembly that allows surface mounting of components to a printed circuit board without downward force applied to the component.

Yet another advantage of the present invention is to provide a latch constructed and arranged such that soldering tails extending from a surface mount component rest on soldering pads of a printed circuit board.

A still further advantage of the present invention is to provide a latch, a method for surface mounting components and a combined assembly of a printed circuit board and a surface mount component which is capable of mounting components at an edge of the printed circuit board, off an edge of a printed circuit or mid-board on the printed circuit board.

And, another advantage of the present invention is to provide a latch for mechanically holding a surface mount component without additional extensions from a printed circuit board.

Moreover, an advantage to the present invention is to provide a latch attached to a surface mount component allowing the use of a standard vacuum head for placement of the surface mount components on the printed circuit board.

A still further advantage is to provide a latch, a method for surface mounting components to a printed circuit board and a combined assembly of a printed circuit board and a surface mount component that is inexpensive to implement.

These and other advantages of the present invention will be described in and will be apparent from the detailed description of the presently preferred embodiments and from the drawings.

These and other features of the invention are set forth below in the following detailed description of the presently preferred embodiments.

DETAILED DESCRIPTION OF THE PRESENTLY PREFERRED EMBODIMENTS

The present invention provides a latch, a method for surface mounting a component with the latch to a printed circuit board and a combined assembly of a printed circuit board and an attached surface mount component or components. The latch of the present invention extends from the surface mount component through an aperture formed through the printed circuit board such that soldering tails extending from the surface mount component are supported on soldering pad of the printed circuit boards for subsequent soldering thereon.

Figure 1:
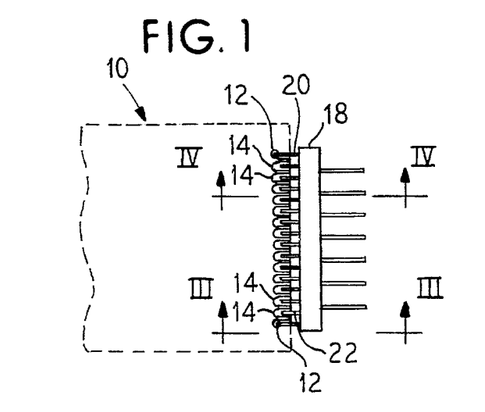
FIG. 1 illustrates a plan view of an embodiment of the present invention illustrating a surface mount component latched and soldered to a printed circuit board in accordance with the principles of the present invention.

Referring now to the drawings wherein like numerals refer to like parts, FIG. 1 illustrates a printed circuit board 10 having a pair of apertures 12 therethrough. Soldering pads 14 are provided on an upper surface 16 of the printed circuit board to provide connection, both mechanically and electrically, between the printed circuit board 10 and a surface mount component 18, such as a male header as illustrated in FIGS. 1–4 or a female connector as illustrated in FIGS. 5–8.

Figure 2:
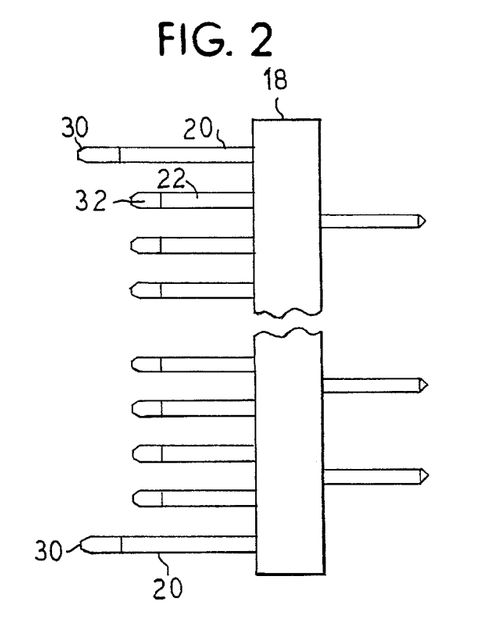
FIG. 2 illustrates an exploded plan view of an embodiment of latches and contacts for the present invention.
Figure 3:
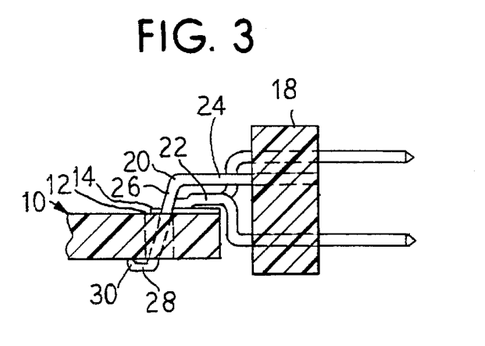
FIG. 3 illustrates a cross-sectional view taken generally along the line III—III of FIG. 1.
Figure 4:
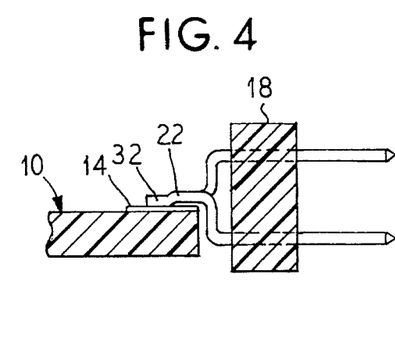
FIG. 4 illustrates a cross-sectional view taken generally along the line IV—IV of FIG. 1.

The surface mount component 18 as illustrated in FIGS. 2–4, includes at least one latch 20 extending therefrom in a direction substantially perpendicular to a length of the component 18. A pair of latches 20 is illustrated in FIG. 2 for subsequent insertion into the apertures 12 of the printed circuit board 10. The latches 20 extend a distance from the surface mount component 18 approximately equal to the a distance which a plurality of solder tails 22 extend from the surface mount component 18. The solder tails 22 also extend a distance substantially equidistantly from the surface mount component 18.

As illustrated in FIG. 3, the latch 20 is integrally formed of a first portion 24 that extends substantially perpendicularly from a length of the component 18. The latch 20 is then bent at an angle and continues for a second portion 26 that extends for a length before being bent at an angle such that a short third portion 28 is provided substantially parallel to the first portion 24. Finally, the latch 20 forms a lip 30 at a tip of the latch 20. Following the first portion 24 of the latch 20, the remainder of the latch 20 including the second portion 26, the third portion 28 and the lip 30 is insertable through the aperture 12 formed through the printed circuit board 10.

The surface mount component 18 is then suspendable from the printed circuit board 10 for subsequent soldering of the solder tails 22 to the solder pads 14 of the printed circuit board 10. In the position illustrated in FIGS. 1 and 4, the solder tails 22 extend such that a slightly detented end portion 32 of the solder tails 22 rest on the soldering pads 14 of the printed circuit board 10 as illustrated in FIG. 4.

Figure 5:
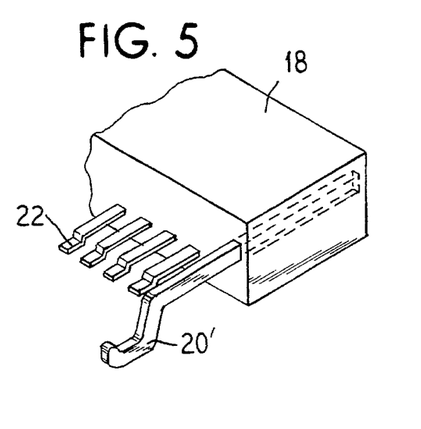
FIG. 5 illustrates an embodiment of a latch of the present invention secured to a surface mount component.
Figure 6:
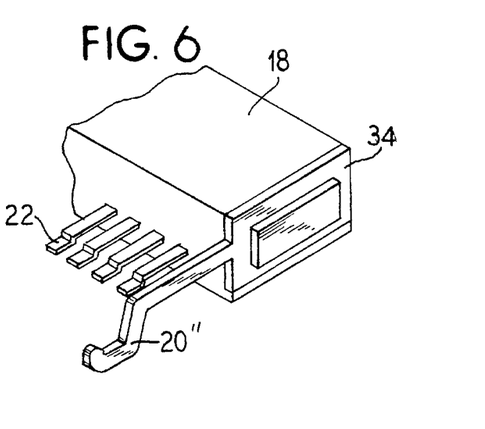
FIG. 6 illustrates an alternative embodiment of a latch of the present invention secured to a surface mount component.
Figure 7:
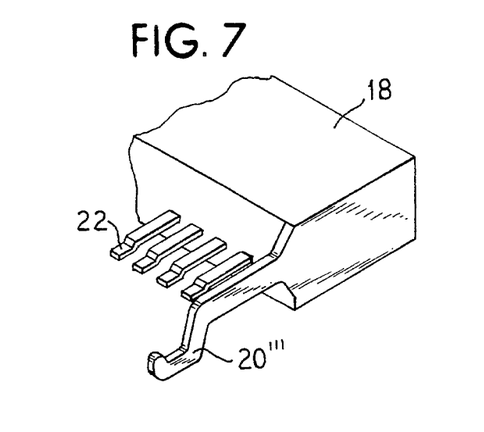
FIG. 7 illustrates another alternative embodiment of a latch of the present invention connected to a surface mount component.

Referring now to FIGS. 5, 6 and 7, alternate embodiments for attaching a latch to the surface mount component 18 are illustrated. In the embodiment illustrated in FIG. 5, the latch 20' is in the form of a pin insertable into the body of the surface mount component 18 as shown in phantom. The latch 20' may be wire made of a metal, for example, inserted into the surface mount component 18. The wire latch 20' may be friction fit into the insulated section of the surface mount component 18 and/or may have a specially designed end having a barb or the like for retaining the wire latch 20' in the surface mount component 18.

In another embodiment, a latch 20" is illustrated in FIG. 6. The latch 20" is a die-stamped style latch attached to an end face of the surface mount component 18. An integrally formed frame 34 is press fit, in an embodiment, over a specially designed end of the surface mount component 18 for receiving the frame 34. The frame 34 may also be adhesively attached, welded or otherwise secured at the end of the surface mount component 18.

FIG. 7 illustrates another embodiment of a latch 20''' molded as a pan of the surface mount component 18. The latch 20''' is, therefore, the same material as the casing of the surface mount component 18, preferably plastic. Since molded plastic is used for the latch 20''' integrally formed with the surface mount component 18, the latch 20''' is constructed substantially larger than the metal wire embodiments of the latch illustrated in FIGS. 5 and 6. Each of the embodiments illustrated in FIGS. 5, 6 and 7 also shows a plurality of solder tails 22 for subsequent soldering to a soldering pad 14 of a printed circuit board 10.

Figure 8:
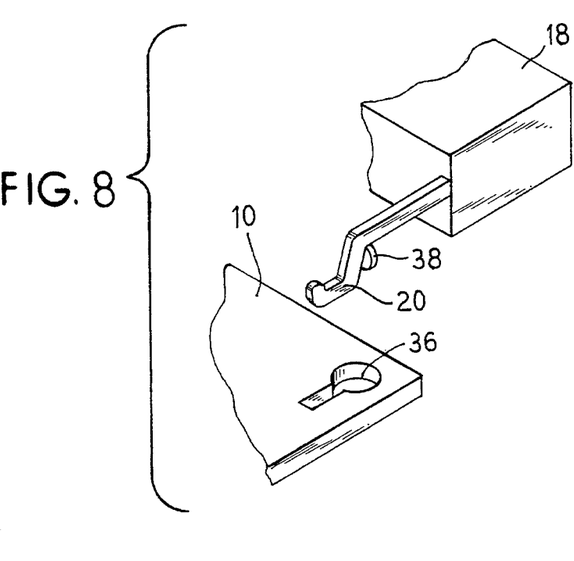
FIG. 8 illustrates an exploded perspective view of an alternative embodiment of a latch connected to a surface mount component and a corresponding aperture in a printed circuit board through which the surface mount component extends.
Figure 9:
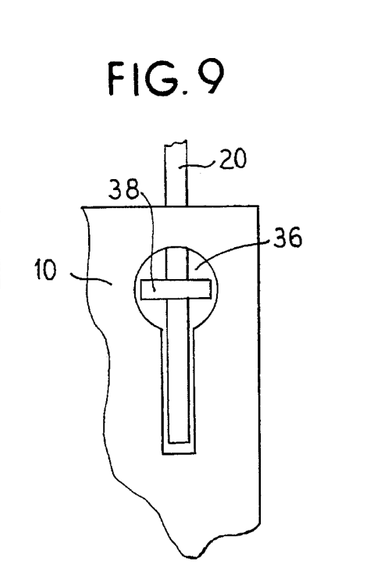
FIG. 9 illustrates a bottom plan view of the embodiment of the latch illustrated in FIG. 8 in the aperture of the printed circuit board illustrated in FIG. 8.

Referring now to FIGS. 8 and 9, a latch 20 is illustrated. The latch 20 may be any type of latch as shown in FIGS. 5, 6 or 7, but, for the sake of simplicity, an integrally molded latch with the surface mount component 18 is shown. The latch 20 illustrated is particularly designed to provide a locator feature used in conjunction with a specially designed key-hole aperture 36 in the printed circuit board 10.

To this end, a locator 38 is provided attached to or integrally formed with the latch 20 such that insertion into the key-hole aperture 36 of the printed circuit board 10 is only provided as a result of alignment of the locator 38 with the widest portion of the key-hole aperture 36. This allows the latch 20 to be moved along the edge of the printed circuit board 10 until the locator 38 matches with the widest portion of the key-hole aperture 36 allowing insertion of the latch 20 therein.

Figure 10:
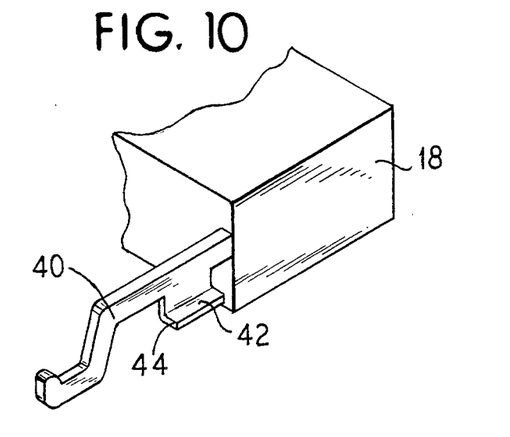
FIG. 10 illustrates a perspective view of another alternate embodiment with a solder tail connected to a latch of the present invention.
Figure 11:
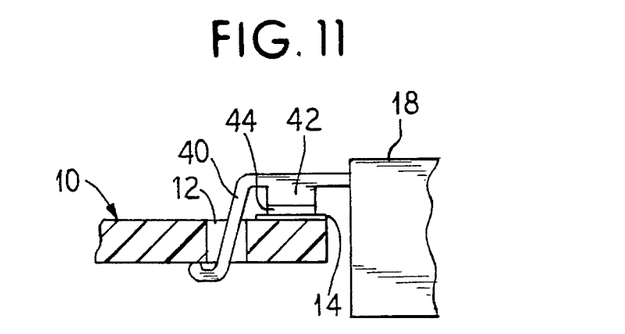
FIG. 11 illustrates a cross-sectional view of a latch of FIG. 10 of the present invention with an added solder pad on the latch for connection to a printed circuit board.

FIGS. 10 and 11 illustrate sitemate embodiments of a latch 40 of the present invention including an integral solder tab 42. The solder tab 42 is integrally formed with the latch 40 such that following placement of the latch 40 as illustrated in FIG. 11, the solder tab 42 may be separately soldered to the printed circuit board 10 providing additional mechanical strength for securing the latch 40 and hence the surface mount component 18. The integral solder tab 42 may be integrally formed with the latch 40, in a preferred embodiment, or separately attached, in another embodiment, to the latch 40 by a conventional means, such as welding, adhesively applied or the like. A lip 44 is formed on the solder tab 42 such that the solder tab lays substantially flat on top of the printed circuit board 10.

Figure 12:
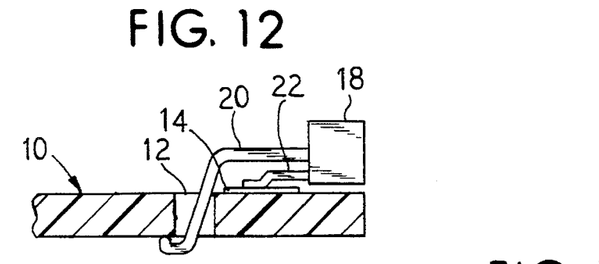
FIG. 12 illustrates a cross-sectional view of a surface mount component mounted on an edge of a printed circuit board with an embodiment of the latch of the present invention and solder tails.
Figure 13:
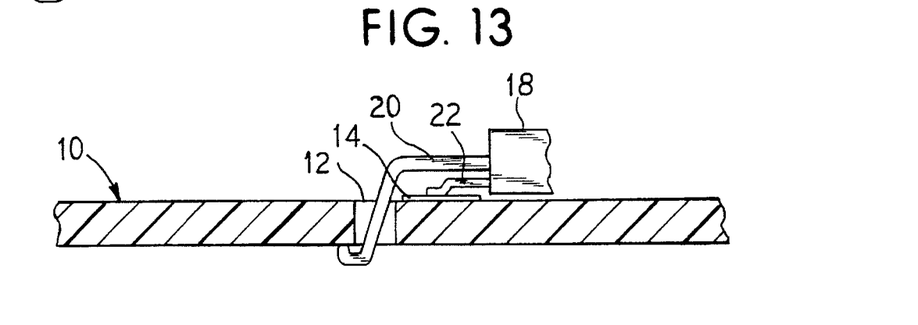
FIG. 13 illustrates a cross-sectional view of a surface mount component mounted midway on a printed circuit board using an embodiment of a latch of the present invention and a solder tail.

Referring now to FIGS. 12 and 13, two different arrangements from the arrangement illustrated in FIG. 1 with the surface mount component extending off the end of the printed circuit board are illustrated. In FIG. 12, the printed circuit board 10 extends such that its end extends substantially the same distance as the surface mount component 18 such that the ends of each, the printed circuit board 10 and the surface mount component 18, are substantially planar. Alternatively, FIG. 13 illustrates the surface mount component 18 at a point on the printed circuit board 10 such that the surface mount component 18 does not extend to its end (as in FIG. 13) or off the end of the printed circuit board 10 (as in FIGS. 1, 3 and 4).

Figures 14, 15, 16:
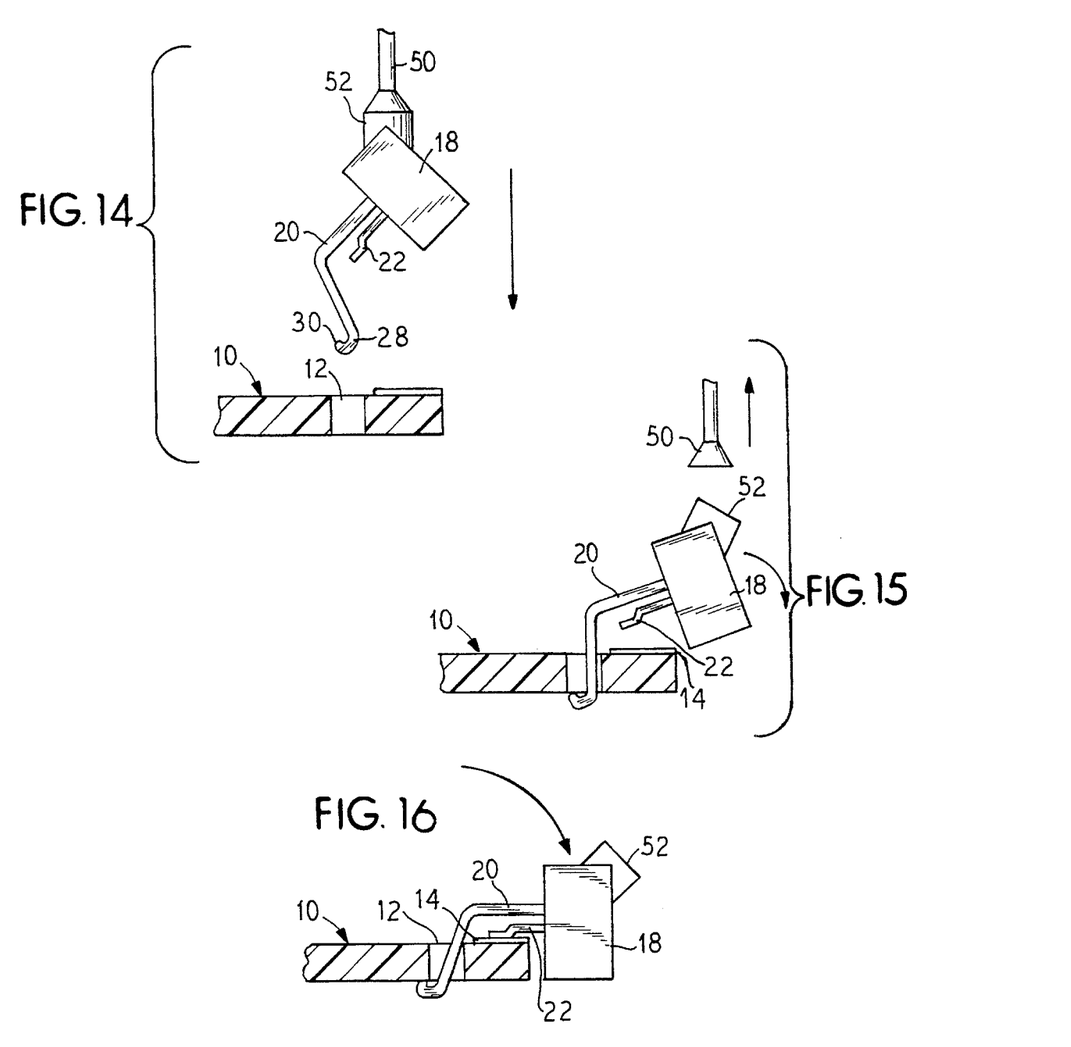
FIG. 14 illustrates a first step of a method for picking a surface mount component for mounting onto a printed circuit board using an embodiment of the latch of the present invention.
FIG. 15 illustrates a second step of placing a surface mount component with the embodiment of the latch component illustrated in FIG. 14.
FIG. 16 illustrates a third step of a method of attaching a solder mount component to a printed circuit board with the embodiment of the latch illustrated in FIGS. 14 and 15.

FIGS. 14–17 illustrate a pick-and-place method implemented for a surface mount component 18 with an embodiment of a latch 20 of the present invention. As illustrated in FIG. 14, a vacuum head 50, as is generally known in the art, may be used to directly pick up the surface mount component 18 or indirectly pick up the surface mount component 18 via an angled feature or cap 52. The cap 52 may be integrally formed as a part of the surface mount component 18 or separately attached thereto. In addition, the component 18 may be weighted to one side via placement of a cap 52 off-center to favor a side in which it is preferred that the component 18 fall after release of the component by the vacuum head or by hand (see FIGS. 22–25). Also the component may be molded so that greater mass is present on a particular side or weighted to fall to that side.

The vacuum head 50, as illustrated in FIG. 14, positions the surface mount component 18 at 90° or less above the aperture 12 of the printed circuit board 10 such that the third portion 28 and a lip 30 of the latch 20 may be inserted through the aperture 12 of the printed circuit board 10 without any forces applied thereto. Following the lowering into the apertures 12, the vacuum head 50 is released as shown in FIG. 15. Upon release of the vacuum head 50, the surface mount component 18 as a result of gravitational forces begins rotating to its horizontal position as shown in FIG. 16 forcing the solder tail 22 to rest on the soldering pad 14 as illustrated in FIG. 16.

Figure 17:
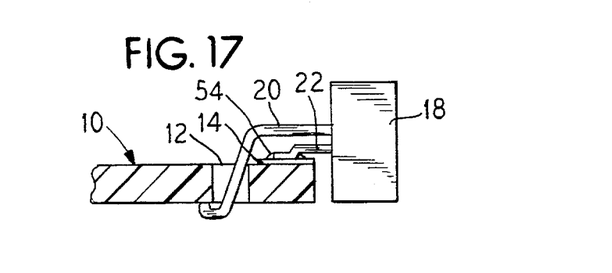
FIG. 17 illustrates a final assembly of a component secured to a surface having the embodiment of the latch illustrated in FIGS. 14, 15 and 16 of the present invention.

In this position, the latch 20 supports the surface mount component 18 from an underside of the printed circuit board 10. The force applied by the weight of the surface mount component 18 on the latch 20 on the underside of the printed circuit board 10 forces the solder tail 22 onto the soldering pad 14. The solder 54 as illustrated in FIG. 17 may then be reflowed around the solder tail 22 on the soldering pad 14 to secure the soldering tail 22, both mechanically and electrically, to the printed circuit board 10. Following the soldering operation, the cap 52 may be removed from the surface mount component 18.

Figure 18:
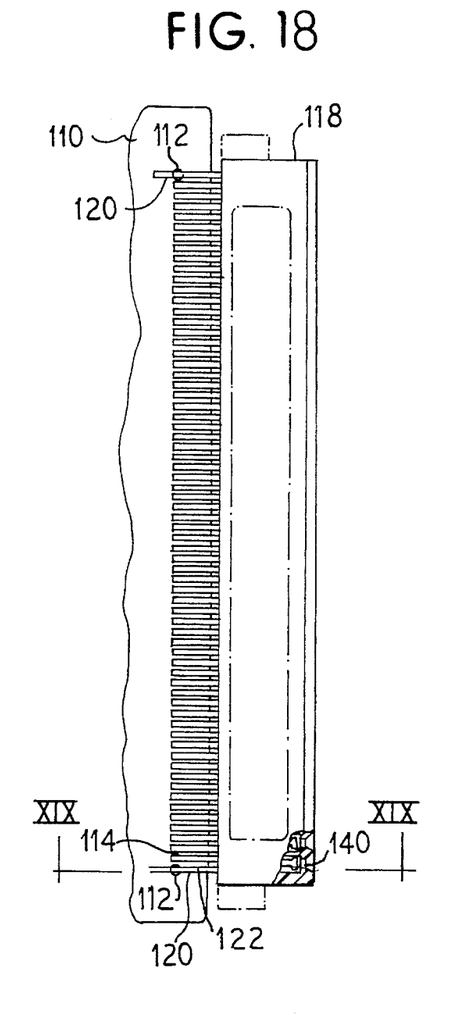
FIG. 18 illustrates a plan view of an alternative embodiment of a latch of the present invention secured to a surface mount component latched and soldered to a printed circuit board.

FIG. 18 illustrates a further embodiment of the present invention including a printed circuit board 110 having a pair of apertures 112 therethrough. Soldering pads 114 are provided on an upper surface of the printed circuit board 110 to provide connection, both mechanically and electrically, between the printed circuit board 110 and the surface mount component 118 via solder tails 122 and latch contacts 120. The surface mount component 118 disclosed a female header. However, a male header may also be combined with the advantages of the present invention.

The surface mount component 118 includes at least one latch contact 120 extending in a direction substantially perpendicular to a length of the component 118. A pair of latch contacts 120 are illustrated in FIG. 18 being inserted into the apertures 112 of the printed circuit board 110. The latch contacts 120 extend a distance from the surface mount component 118 greater than a distance which a plurality of solder tails 122 extend from the surface mount component 118. The plurality of solder tails 122 extend a distance substantially equidistant from the surface mount component 118. In contrast to the other embodiments of this invention, the latching feature is combined with a contact or solder tail of the surface mount component 118. In the other embodiments, the header of the surface mount component 118 included an extra contact member supported at the ends of the header. In the embodiment of FIG. 18, the replacement of a pair of solder tails with a pair of latch contacts 120 may be easily performed and provides for the securement of the surface mount component to a printed circuit board 110.

Figure 19:
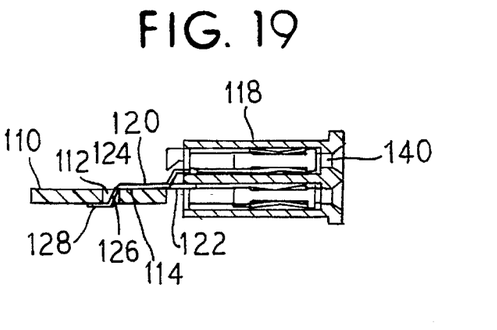
FIG. 19 illustrates a cross-sectional view of FIG. 18, taken at line 19—19.

Turning to FIG. 19, a cross-sectional view of FIG. 18, taken at line 19-19 is illustrated. The surface mount component 118 is shown mounted to and soldered to a printed circuit board 110. The surface mount component 118 includes a plurality of contacts 122 spaced along the length of the component 118. The contacts 122 alternate their insertion point in the surface mount component 118 at higher and lower points or different heights along the thickness of the component 118. Latch contact 120, similar to the other contacts 122, is surface mounted to a pad 114 of the printed circuit board 110 along a first portion 124 of the latch contact 120. The latch contact 120 is bent at a second portion 126 at an aperture 112. The latch contact 120 is latched to the printed circuit board 110 by a third portion 128 which is bent parallel to the first portion 124. The third portion 128 is bent so that the clearance between the bottom of the printed circuit board 110 and the contact latch 120 at its third section 128 is 0.010 inches or less. The third portion section 128 is extremely close to the bottom of the printed circuit board 110 so that the printed circuit board may remain relatively flat when the bottom surface of the printed circuit board is set on a flat surface such as a conveyor belt of an infrared oven, or when the printed circuit board is incorporated in a device. Because the latch contact 120 is formed of metal contact material, it has a narrow thickness which allows for an extremely low profile along the bottom of the printed circuit board. In the previous embodiments discussed, the latch was formed of a wire material having generally a greater thickness than the latch contact 120 of FIGS. 18–19. Following soldering of the surface mount component 118 to the printed circuit board 110, passages 140 may receive pins of a peripheral component to make electrical connection through the contacts 122 and the contact latch 120 with the printed circuit board 110.

Figure 20:
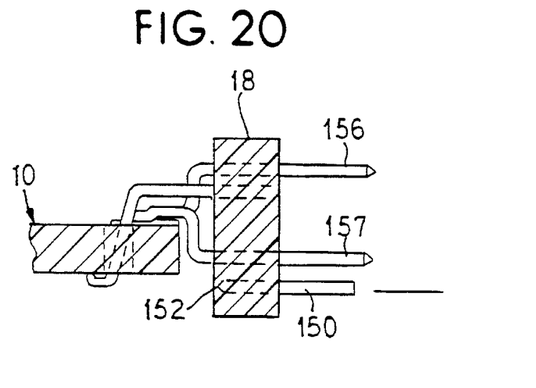
FIG. 20 illustrates a cross-sectional view of an alternative embodiment of the present invention including a board locking pin in a staged position.

Turning to FIG. 20, a further embodiment of the present invention is shown. The surface mount component 18 is shown soldered to printed circuit board 10. The surface mount component 18 includes a board mount pin 150. The board mount pin 150 is shown in a staged position in channel 152 of the component 18. Once the surface mount component 18 is soldered to printed circuit board 10, it is ready to receive a mating component which is mounted onto component pins 156,157 in direction of arrow 160. Upon mating, the board latch pin 150 will be slid through channel 152 in direction of arrow 160.

Figure 21:
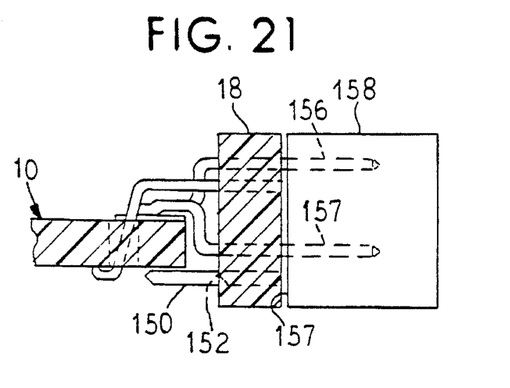
FIG. 21 illustrates a cross-sectional view of the embodiment of FIG. 20 including board locking pin in a locked position.

Turning to FIG. 21, mating component 158 is shown mounted to component pins 156,157. Upon insertion of the mating component 158, its front surface 159 abuts the rear of board latch pin 150 and pushes it through the channel 152 into its latching position. The board latch pin 150 provides additional mechanical strength to the assembly, including anti-rotational for applications subject to rough handling or extended mating and unmating cycles. The board latch pin 150 may aim prevent the assembly from lifting when side loads are applied and also to compensate for board thickness tolerance by pulling the surface mount component 18 into a position parallel to the circuit board 10 when placed on a circuit board that is at the maximum end of specification. While the preferred embodiment shown discloses a board latch pin 150 which is automatically oriented after soldering of the component to a printed circuit board, any such board latch pin which helps support the surface mount component is envisioned by the present invention, including a pin which is placed manually after soldering or via use of a push-home tool. Further, any number of board latch pins 150 may be present depending on the length of the board mount component 18. Also, the board latch pin 150 may include projections and/or the channel 152 may have corresponding recesses for holding the board latch pin 150 in a staged or latched position.

Figure 22:
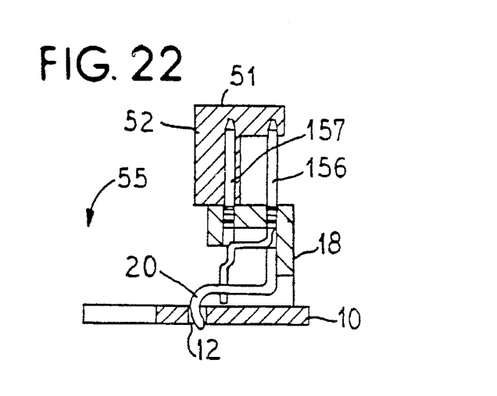
FIG. 22 illustrates a cross-sectional view of an alternative embodiment of the present invention in a first position.

Turning to FIGS. 22–25, a further embodiment of the present invention is shown. These figures show the board mount component 18 and its mounting to printed circuit board 10. FIG. 22 shows the board mount component 18 as it is initially placed onto the circuit board 10. The latch 20 is aligned with aperture 12 and inserted therein. The board mount component 18 includes a cap 52 which is mounted to component pins 156,157. The embodiment shown in FIGS. 22–25 is different from previous embodiments (FIG. 14), in that the cap 52 is attached to the component pins and the surface mount component is placed on the circuit board 10 at a 90° angle. A suction cup may be attached to the cap 52 at surface 51 to release the surface mount component 18 at a 90° angle to the printed circuit board 10. The cap 52 is weighted so that it is offset to the left and allows for the surface mount component to rotate to the left or in direction of arrow 55 upon activation of gravitational forces after release of the cap 52 by a pick-and-place machine or a hand.

Figure 23:
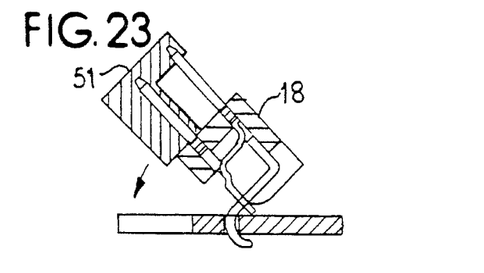
FIG. 23 illustrates a cross-sectional view of an alternative embodiment of the present invention in a second position.

FIG. 23 shows the surface mount component 18 in a free fail from its placed position after release of the suction cup from vacuum pick-and-placement at surface 51. As the latch 20 has a smaller cross-sectional area than the aperture 12, a zero mounting force is required and mere gravitational forces may enact placement.

Figure 24:
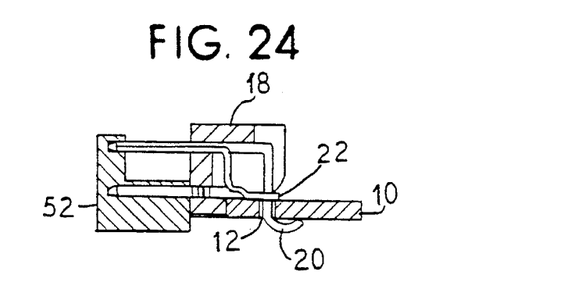
FIG. 24 illustrates a cross-sectional view of an alternative embodiment of the present invention in a third position.
Figure 25:
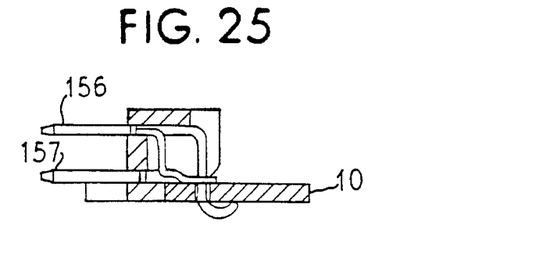
FIG. 25 illustrates a cross-sectional view of an alternative embodiment of the present invention in a fourth position.

FIG. 24 shows the surface mount component 18 in its fully mounted position where the latch 20 has achieved its fully inserted position in aperture 12 and surface mount tail 22 is in parallel relationship with the circuit board 10. The cap 52 is shown protruding from the edge of the printed circuit board. As the cap's use as a weighting device and as a pick-and-place cap has been achieved, as shown in FIG. 25, the cap 52 is removed leaving component pins 156,157 bare, in order to receive a mounting component thereto. The surface mount component may then be soldered to a printed circuit board 10 by reflowing solder around solder tails 22 and providing mechanical and electrical connection.

It should be understood that various changes and modifications to the presently preferred embodiments described herein will be apparent to those skilled in the art. For example, the latch may be shaped to provide an interference fit with the board so that the board mount component may require a small force to push it down and position it on the board and also provide a clicking sound of the latch being forced through the aperture in the board. Such changes and modifications may be made without departing from the spirit and scope of the present invention and without diminishing its attendant advantages. It is, therefore, intended that such changes and modifications be covered by the appended claims.

What is claimed is:

1. A latch extending from a component having a plurality of soldering tails extending substantially equidistantly from an end of the component at points substantially equidistantly from a base of the component wherein the component requires mounting to a printed circuit board, the latch comprising:

a latch contact having a first portion connected to the component in a direction substantially perpendicular to the length of the component, the first end connected to the component and a second portion angled from the first potion and protrudes through an aperture in the printed circuit board and a third portion extends parallel to the first portion and terminates at a point at or below the points at which the soldering tails are arranged above the base.

2. The latch of claim 1 wherein the latch contact extends from the component for a length at least equal to the length of the soldering tails.

3. The latch of claim 1 wherein the latch contact includes a soldering portion at a height approximately equal to the height of to the soldering tails for soldering to the printed circuit board.

4. The latch of claim 1 further comprising:

a pair of latch contacts at each end of the component having the plurality of soldering tails therebetween.

5. The latch of claim 1 wherein the latch contact is formed of the same material as the soldering tails.

6. The latch of claim 1 wherein the latch contact is die-stamped and attached to the component.

7. The latch of claim 1 wherein the latch contact is a wire pin extending from the end of the component from which the plurality of soldering tails extend.

8. A combined assembly of a printed circuit board and an attached surface mount component, the combined assembly comprising:

a plurality of soldering tails extending from the component;

a latch contact having a first portion extending in a direction substantially perpendicular to the length of the component and a second portion angled from the first portion and a third portion extends parallel to the first portion; and an aperture through the printed circuit board receiving the second portion of the latch contact therethrough wherein the plurality of soldering tails rest on a face of the printed circuit board through which the latch contact extends, the latch contact having a cross-sectional area smaller than the aperture thereby receiving the latch contact without force.

9. The combined assembly of claim 8 wherein a soldering pad on the face of the printed circuit board corresponds to the latch contact, the latch contact resting on the soldering pad.

10. The combined assembly of claim 8 wherein the latch contact is a soldering tail extending from the component a distance from the component greater than the plurality of soldering tails.

11. The combined assembly of claim 8 further comprising: a second latch contact remotely attached to the component at a distance from the first latch contact, the second latch contact substantially identical to the first latch contact.

12. The combined assembly of claim 8 further comprising: a board latch pin attached to the component and being movable into position under the printed circuit board after the plurality of soldering tails are soldered to the soldering pads of the printed circuit board.

13. A combined assembly of a printed circuit board and an attached surface mount component mated thereon with a zero mounting force, the combined assembly comprising:

a plurality of soldering tails exuding from the component;

a latch contact having a first portion extending substantially perpendicular to the length of the component and a second portion angled from the first portion and a third portion extends parallel to the first portion;

an aperture through the printed circuit board receiving the second portion of the latch contact therethrough wherein the plurality of soldering tails rests on a face of the printed circuit board through which the latch contact extends;

the latch contact having a cross-sectional area smaller than the aperture thereby receiving the latch contact without force; and a board latch pin mounted within the component being movable under the printed circuit after soldering of the component thereto.

14. The combined assembly of claim 13 wherein the board latch pin is slidably inserted within a channel of the component and slidable from a staged position to a latched position.

15. The combined assembly of claim 13 wherein the channel containing the board latch pin is oriented so that upon assembly of a mating component to the surface mount component, a front face of the mating component abuts the rear of the board latch pin, forcing it to slide through the channel and attain its latched orientation under the printed circuit board.

16. The combined assembly of claim 16 wherein the board latch pin includes a projection for retaining the board latch pin within the channel.

17. The combined assembly of claim 13 wherein a cap is temporarily placed on a component pin of the component to provide for weighting of the component and a surface for robotic pick-and-placement.

* * * * *